United States Patent
Wang et al.

(10) Patent No.: US 9,960,237 B2
(45) Date of Patent: May 1, 2018

(54) TERMINATION STRUCTURE WITH MULTIPLE EMBEDDED POTENTIAL SPREADING CAPACITIVE STRUCTURES FOR TRENCH MOSFET

(71) Applicant: Alpha and Omega Semiconductor Incorporated, Sunnyvale, CA (US)

(72) Inventors: Xiaobin Wang, San Jose, CA (US); Anup Bhalla, San Jose, CA (US); Hamza Yilmaz, Saratoga, CA (US); Daniel Ng, Campbell, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days. days.

(21) Appl. No.: 14/684,570

(22) Filed: Apr. 13, 2015

(65) Prior Publication Data

US 2015/0214312 A1 Jul. 30, 2015
US 2017/0053989 A9 Feb. 23, 2017

Related U.S. Application Data

(62) Division of application No. 13/712,980, filed on Dec. 13, 2012, now Pat. No. 9,029,236, which is a division
(Continued)

(51) Int. Cl.
*H01L 29/66* (2006.01)
*H01L 29/40* (2006.01)
(Continued)

(52) U.S. Cl.
CPC ...... *H01L 29/407* (2013.01); *H01L 21/76205* (2013.01); *H01L 29/0638* (2013.01);
(Continued)

(58) Field of Classification Search
CPC ............. H01L 29/7802; H01L 29/1095; H01L 29/0696; H01L 29/407; H01L 21/76205
(Continued)

(56) References Cited

U.S. PATENT DOCUMENTS

2006/0011976 A1* 1/2006 Darwish ............. H01L 29/7813
257/341
2006/0118833 A1* 6/2006 Lanois .................. H01L 29/407
257/256
(Continued)

*Primary Examiner* — Long K Tran
(74) *Attorney, Agent, or Firm* — Chein-Hwa Tsao; Lance A. Li; 5Suns

(57) ABSTRACT

A termination structure with multiple embedded potential spreading capacitive structures (TSMEC) and method are disclosed for terminating an adjacent trench MOSFET atop a bulk semiconductor layer (BSL) with bottom drain electrode. The BSL has a proximal bulk semiconductor wall (PBSW) supporting drain-source voltage (DSV) and separating TSMEC from trench MOSFET. The TSMEC has oxide-filled large deep trench (OFLDT) bounded by PBSW and a distal bulk semiconductor wall (DBSW). The OFLDT includes a large deep oxide trench into the BSL and embedded capacitive structures (EBCS) located inside the large deep oxide trench and between PBSW and DBSW for spatially spreading the DSV across them. In one embodiment, the EBCS contains interleaved conductive embedded polycrystalline semiconductor regions (EPSR) and oxide columns (OXC) of the OFLDT, a proximal EPSR next to PBSW is connected to an active upper source region and a distal EPSR next to DBSW is connected to the DBSW.

8 Claims, 13 Drawing Sheets

Related U.S. Application Data of application No. 12/704,528, filed on Feb. 12, 2010, now Pat. No. 8,399,925.

(51) Int. Cl.

| | | |
|---|---|---|
| *H01L 29/78* | (2006.01) | |
| *H01L 21/762* | (2006.01) | |
| *H01L 29/06* | (2006.01) | |
| *H01L 29/417* | (2006.01) | |
| *H01L 29/423* | (2006.01) | |
| *H01L 29/04* | (2006.01) | |

(52) U.S. Cl.
CPC .... *H01L 29/0649* (2013.01); *H01L 29/66727* (2013.01); *H01L 29/66734* (2013.01); *H01L 29/7803* (2013.01); *H01L 29/7811* (2013.01); *H01L 29/7813* (2013.01); *H01L 29/04* (2013.01); *H01L 29/0619* (2013.01); *H01L 29/0696* (2013.01); *H01L 29/402* (2013.01); *H01L 29/41766* (2013.01); *H01L 29/42368* (2013.01); *H01L 2924/0002* (2013.01)

(58) Field of Classification Search
USPC .................................. 257/341, 488
See application file for complete search history.

(56) References Cited

U.S. PATENT DOCUMENTS

| | | | |
|---|---|---|---|
| 2008/0179662 A1* | 7/2008 | Hshieh | H01L 29/407 257/328 |
| 2011/0140228 A1* | 6/2011 | Wang | H01L 21/76202 257/506 |
| 2011/0198605 A1* | 8/2011 | Wang | H01L 29/407 257/71 |

\* cited by examiner

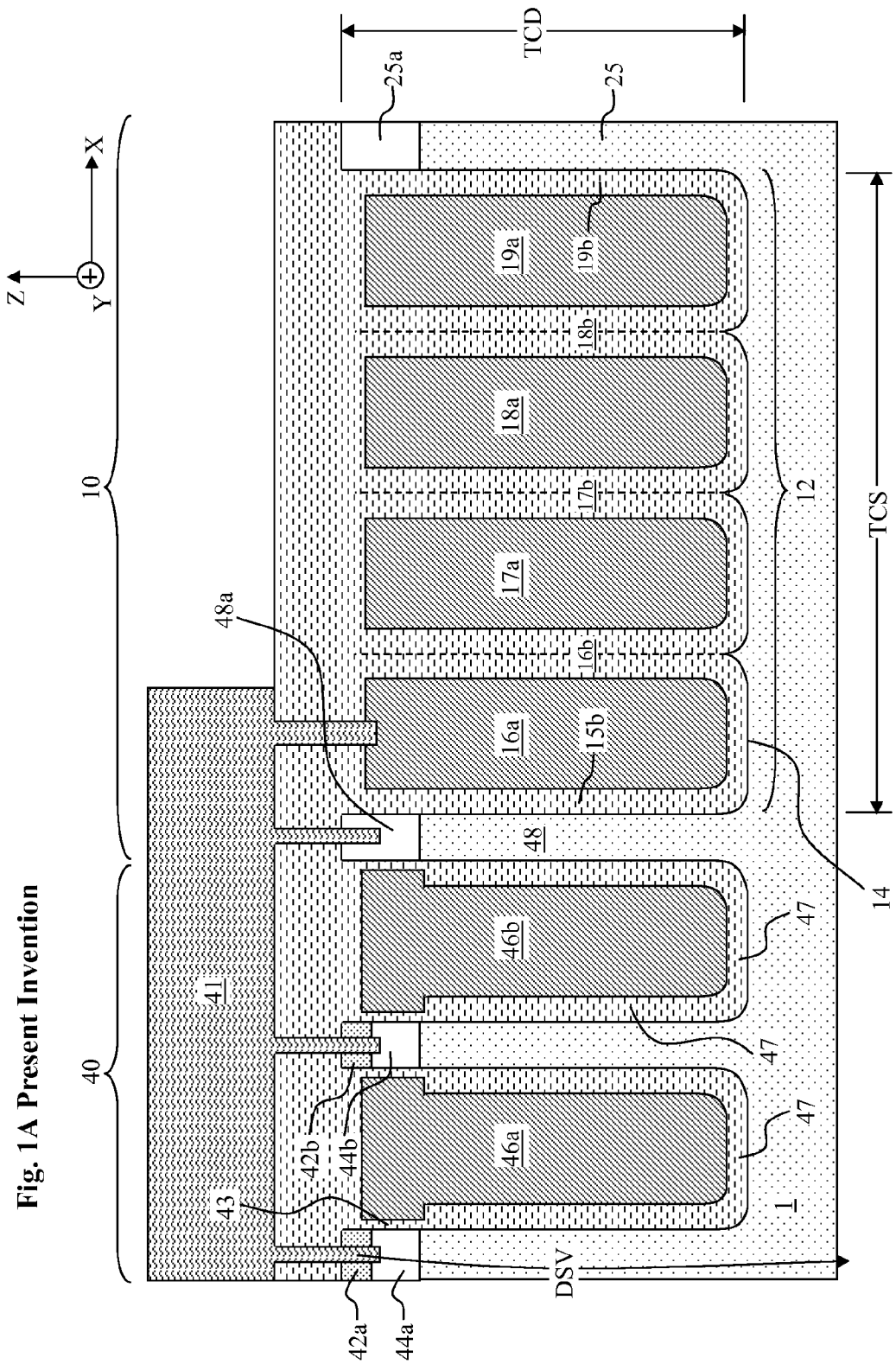
Fig. 1A Present Invention

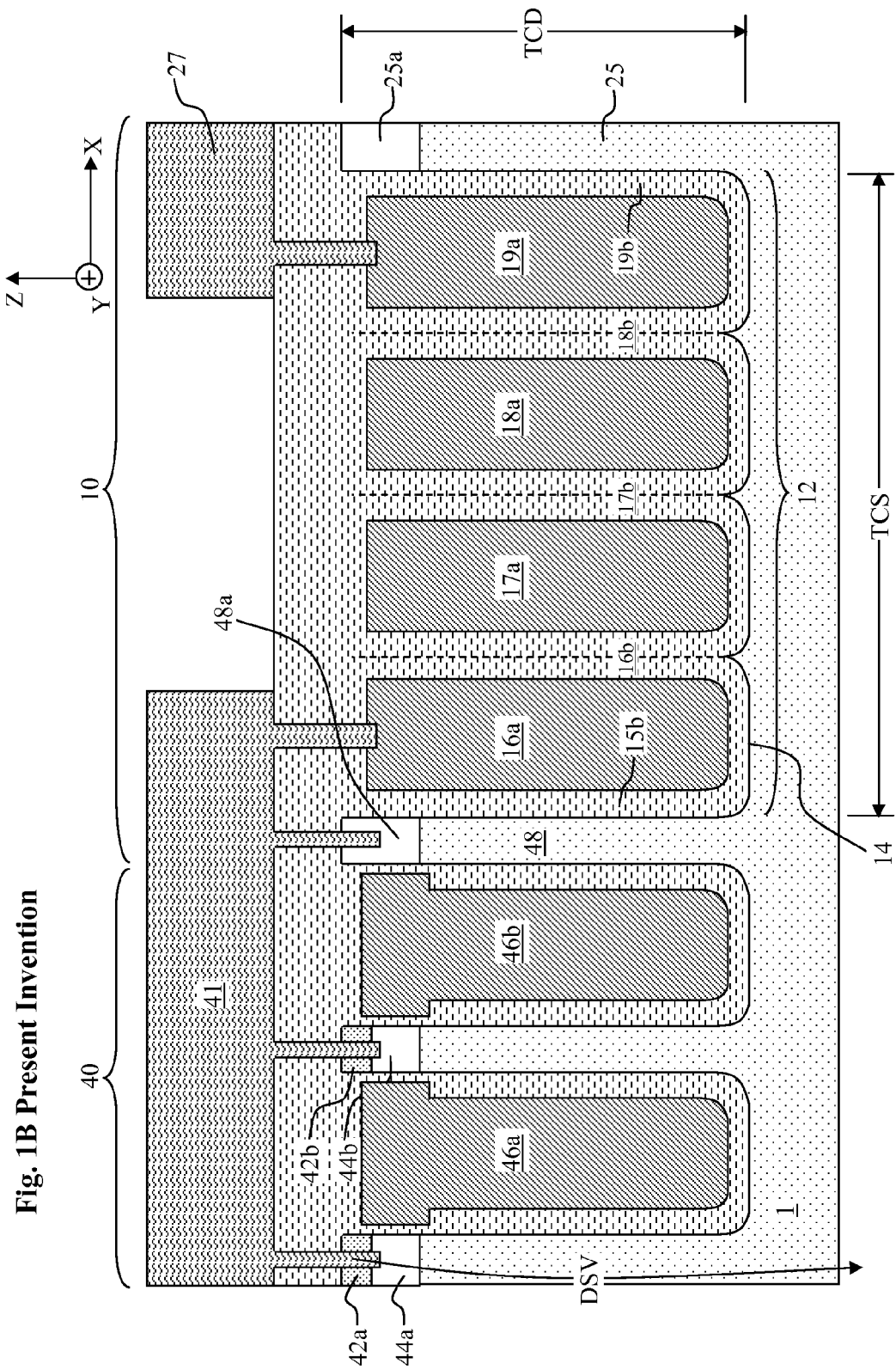
Fig. 1B Present Invention

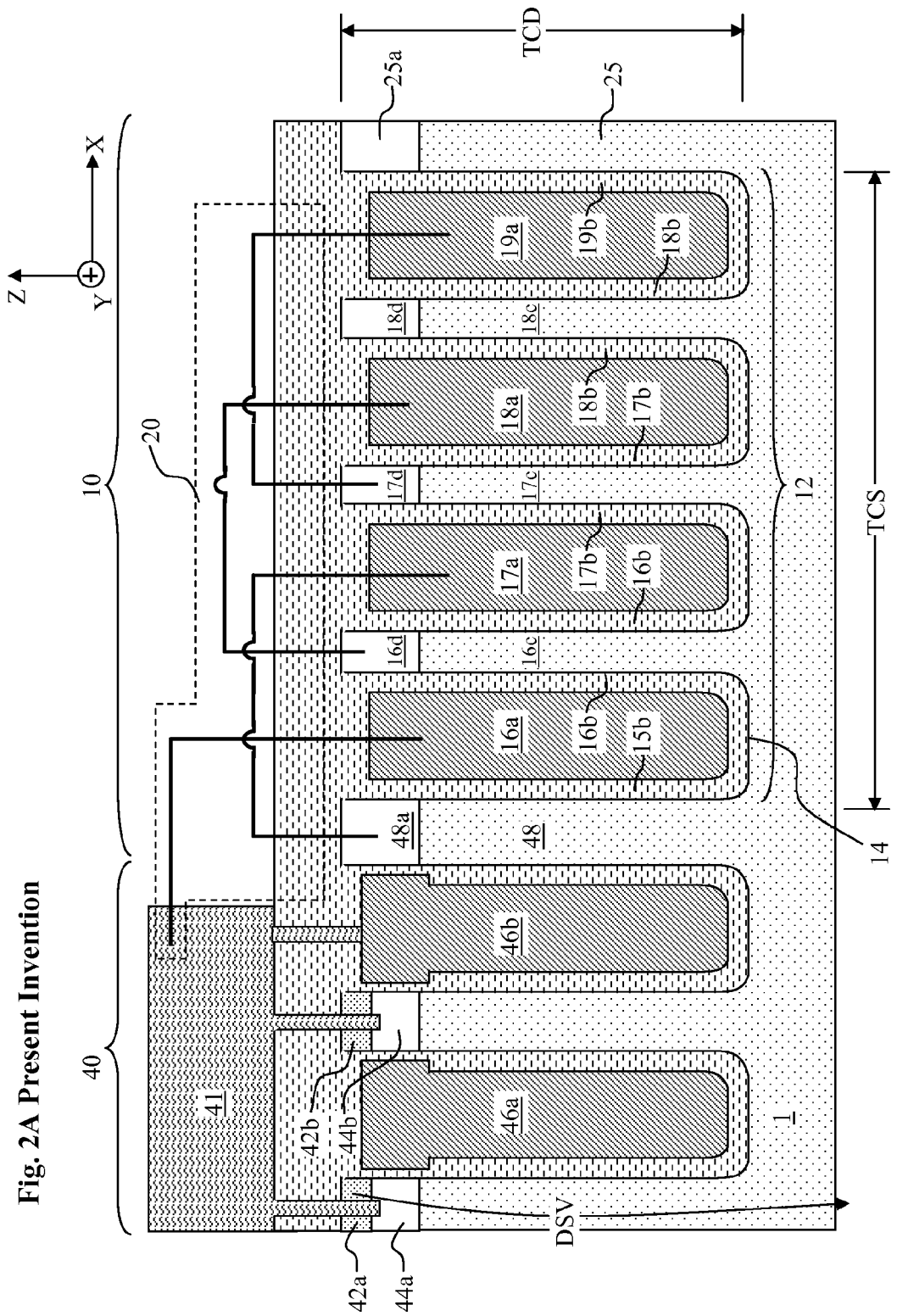
Fig. 2A Present Invention

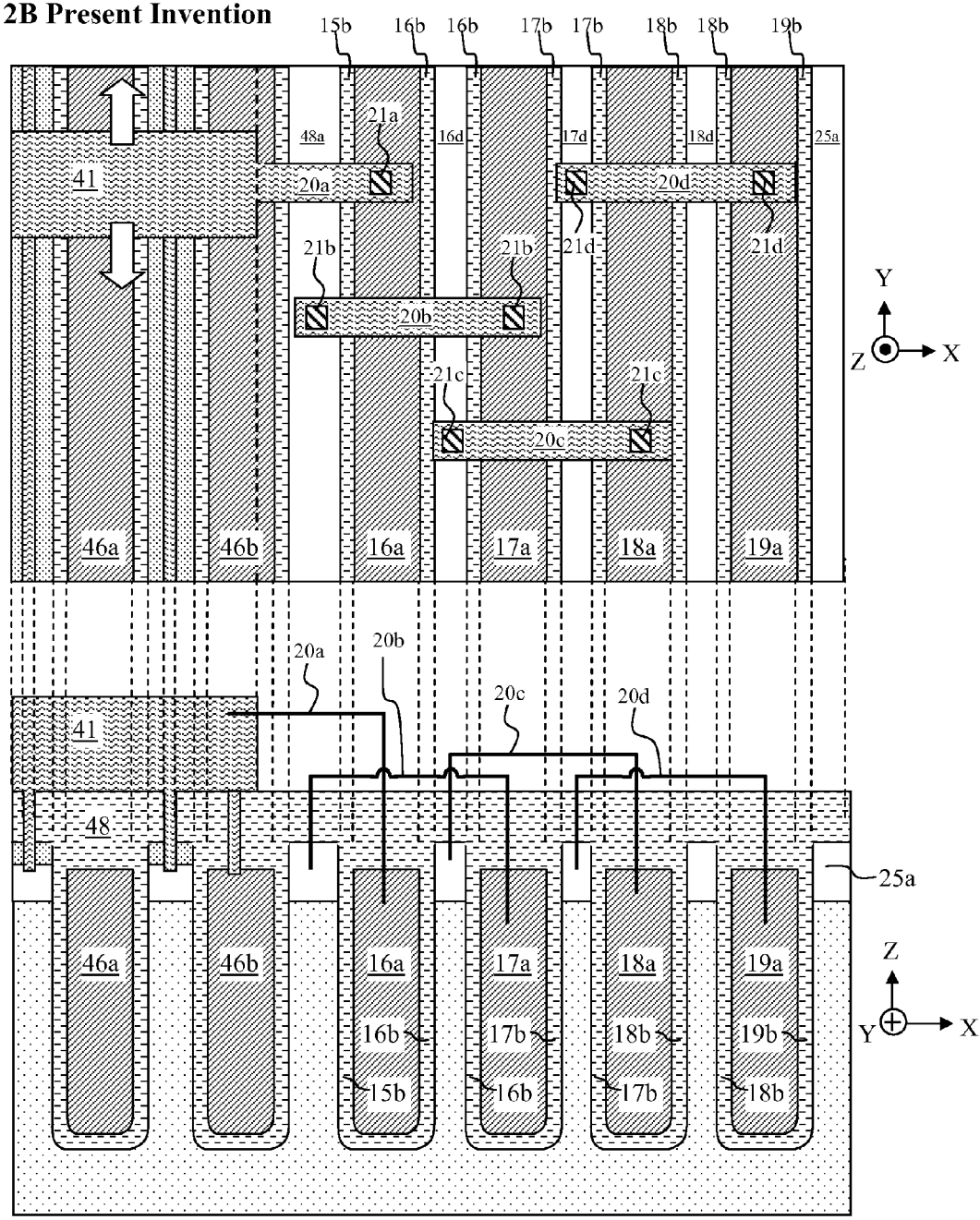
Fig. 2B Present Invention
Fig. 2C Present Invention

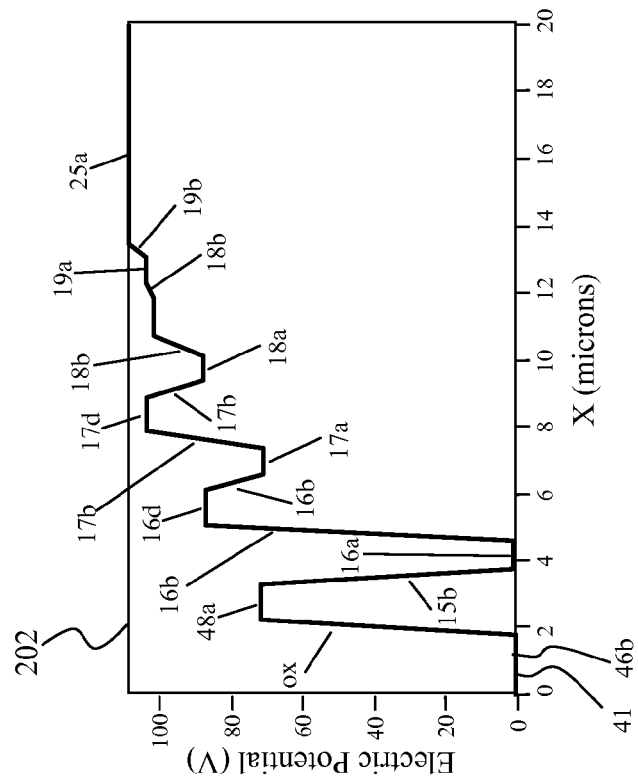
Fig. 4 Present Invention
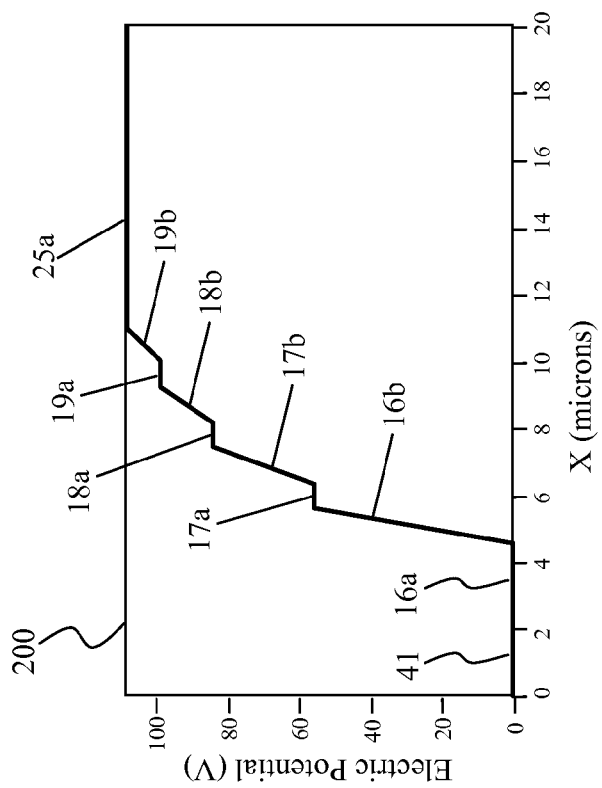
Fig. 3 Present Invention

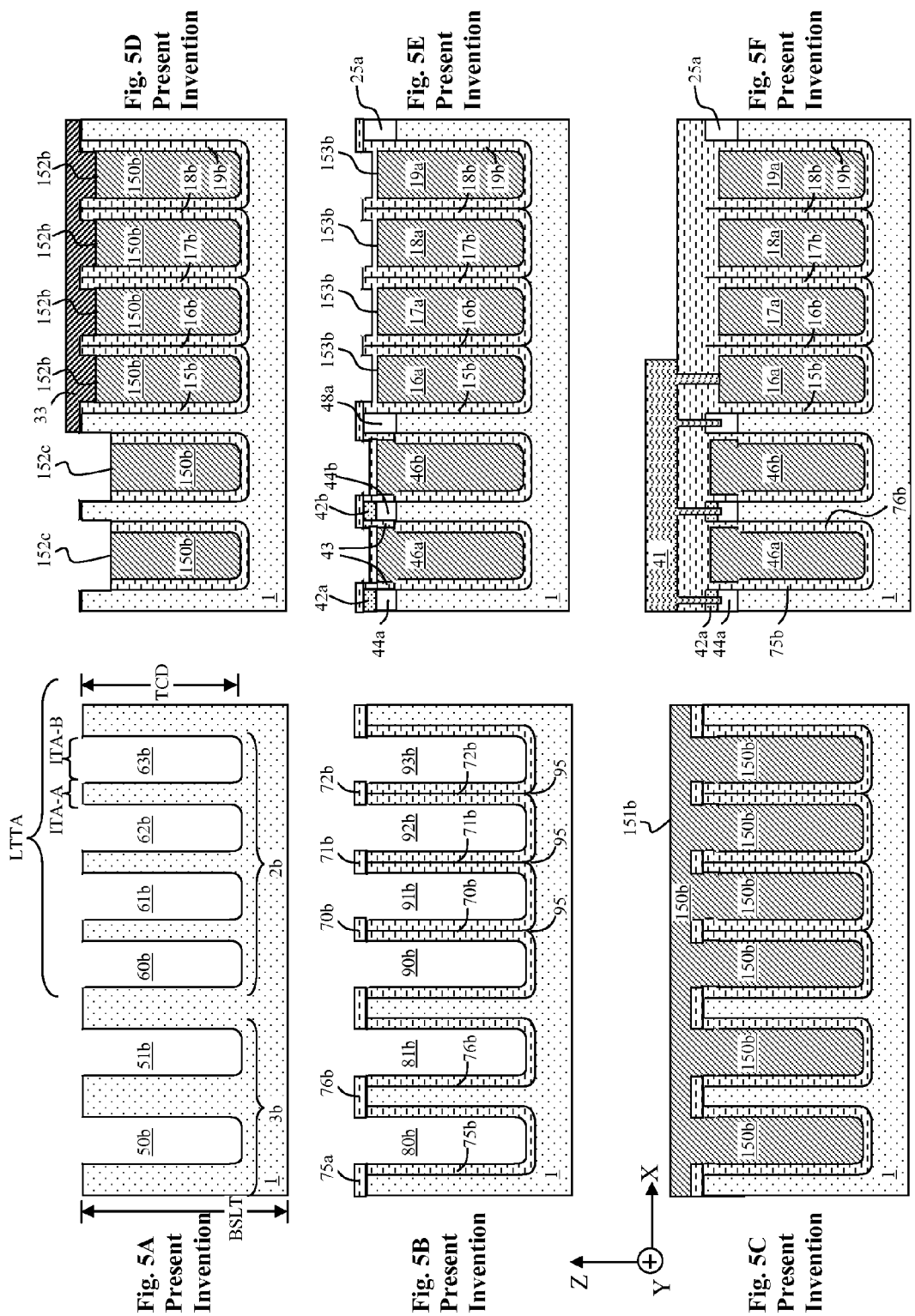

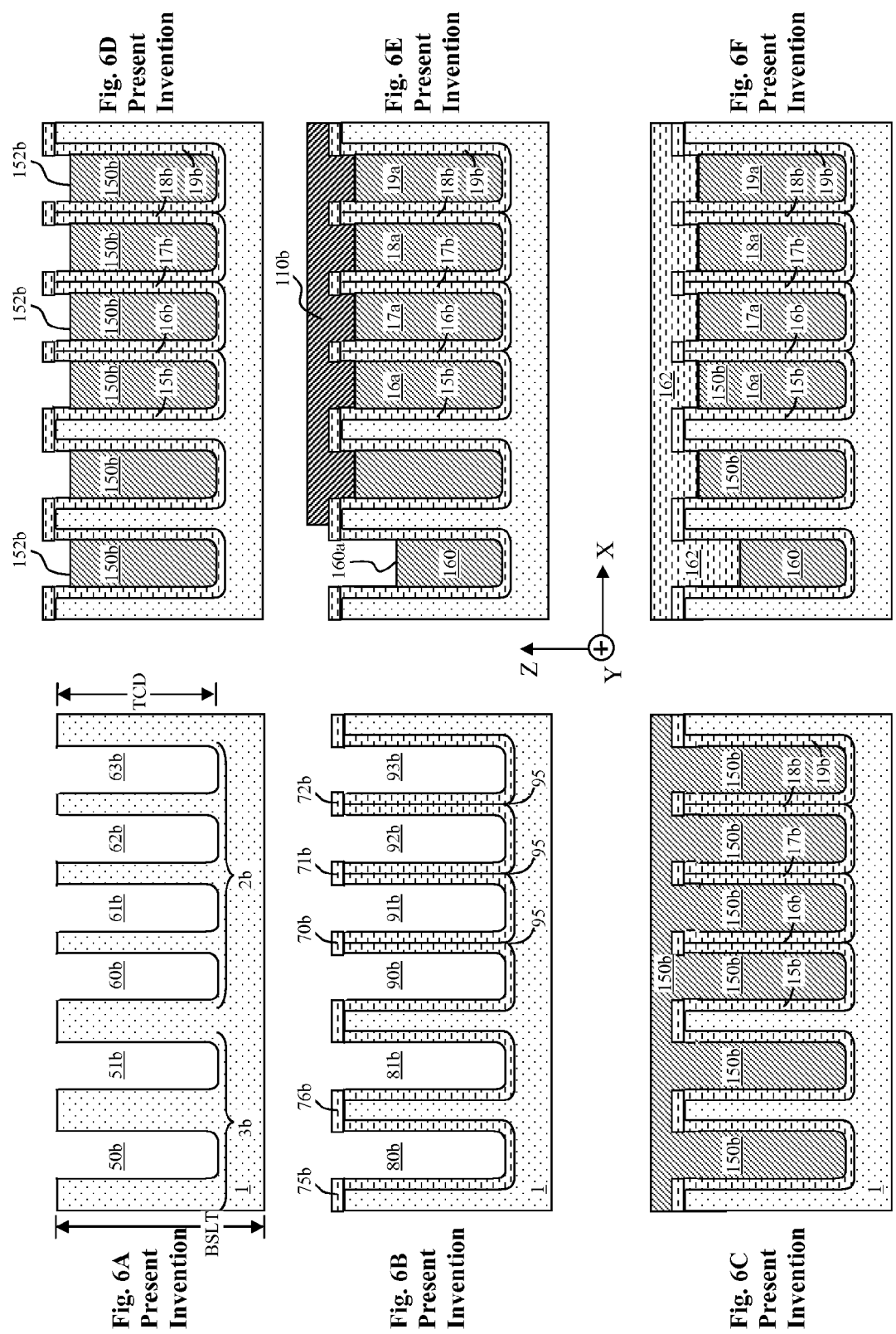

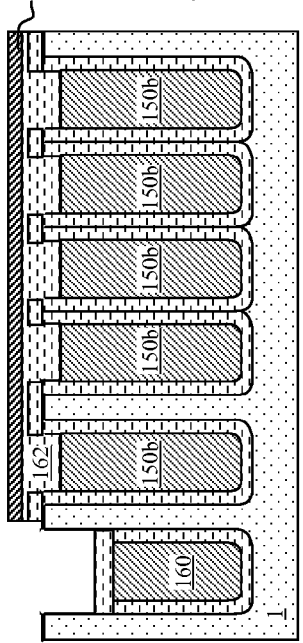
Fig. 6G
Present
Invention
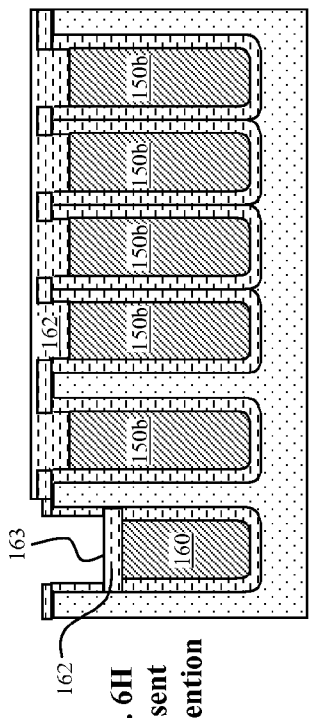
Fig. 6H
Present
Invention
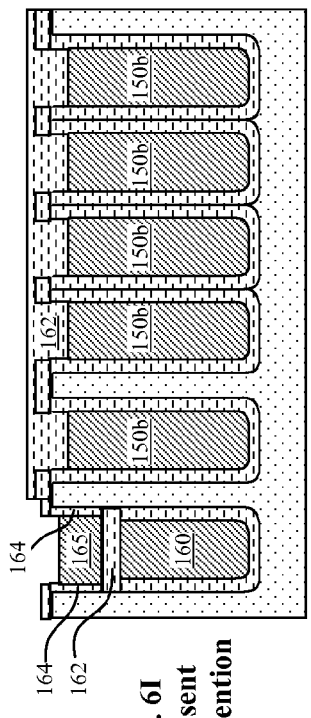
Fig. 6I
Present
Invention
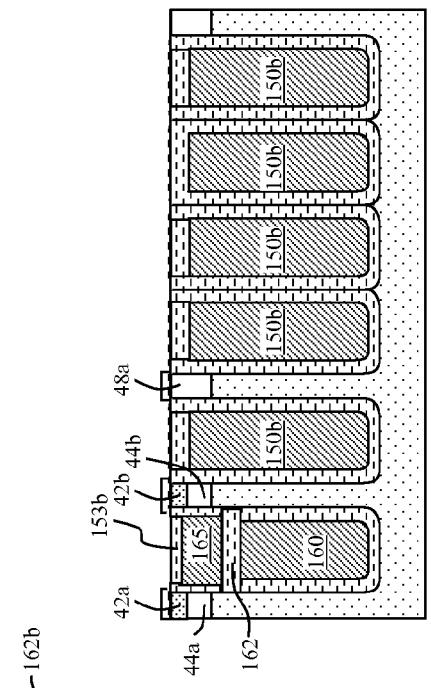
Fig. 6J
Present
Invention
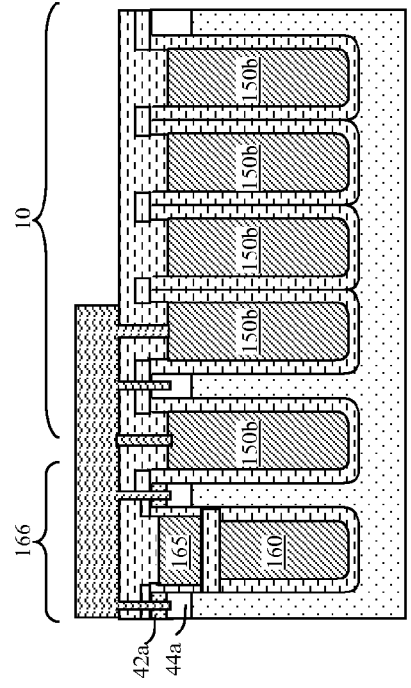
Fig. 6K
Present
Invention
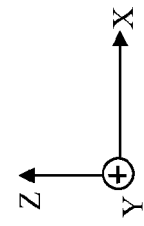

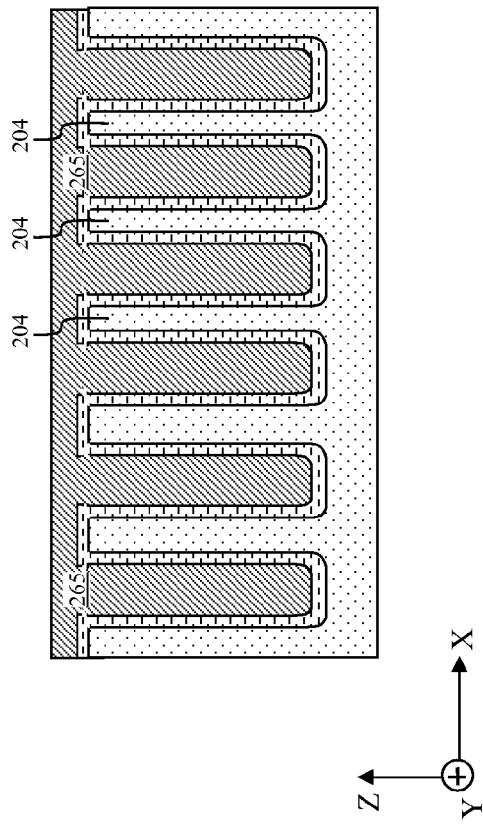
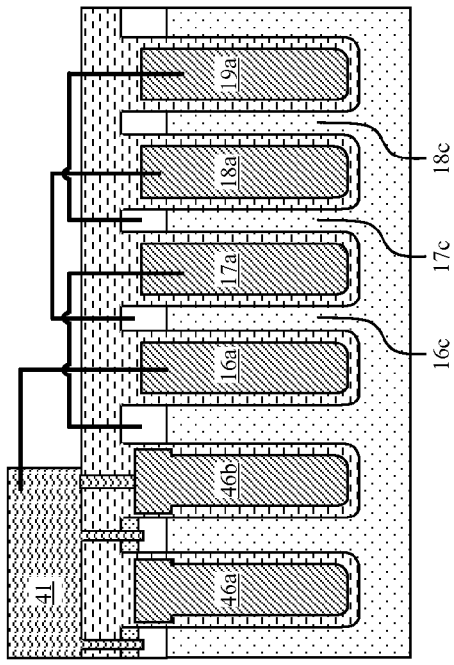
Fig. 7C Present Invention
Fig. 7D Present Invention
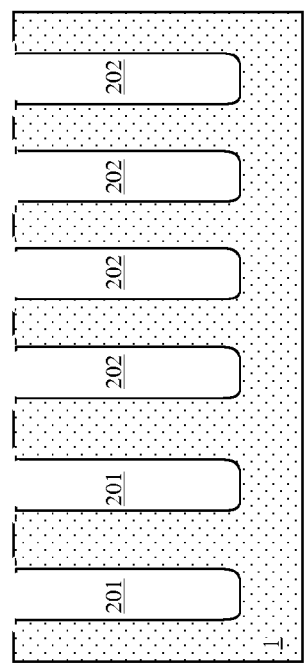
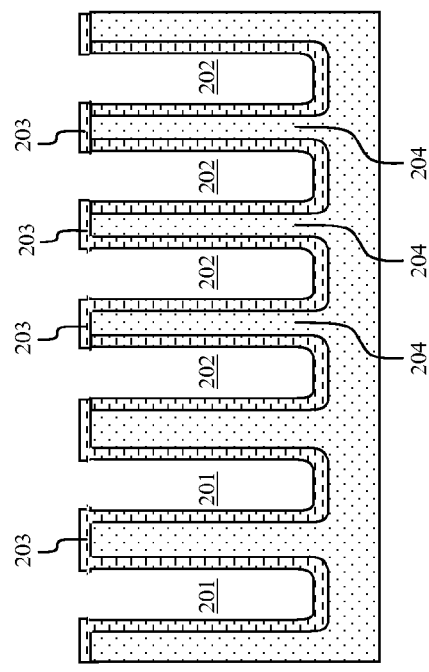
Fig. 7A Present Invention
Fig. 7B Present Invention

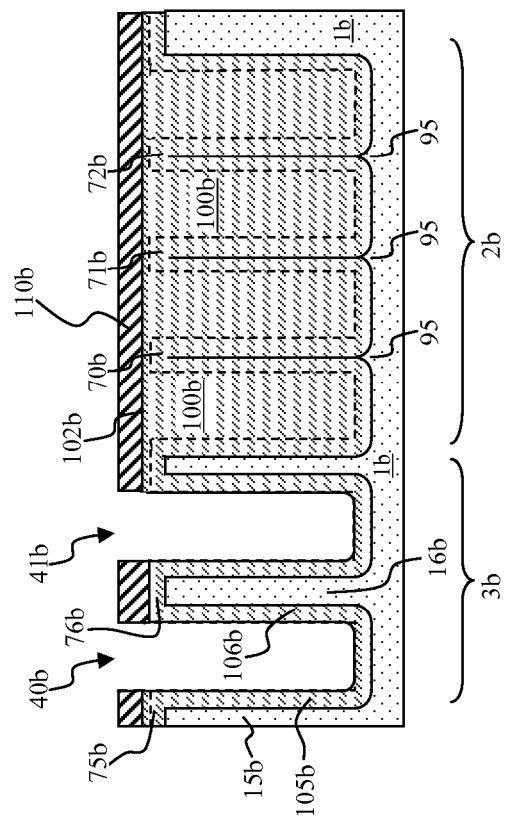
Fig. 8B2 Prior Art
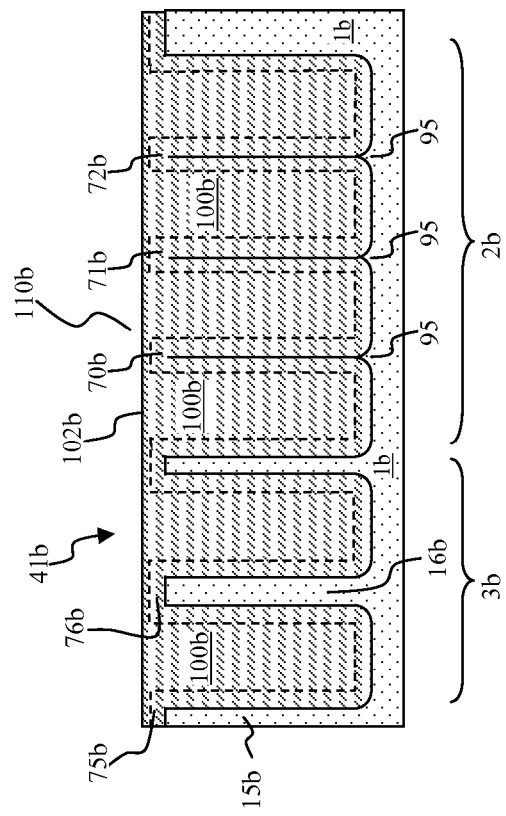
Fig. 8B1 Prior Art

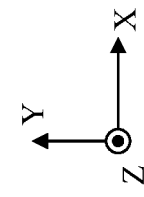
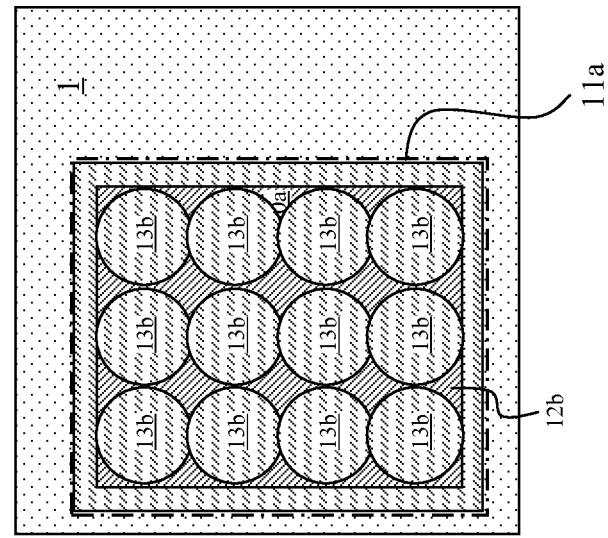
Fig. 8C1 Prior Art
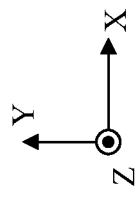
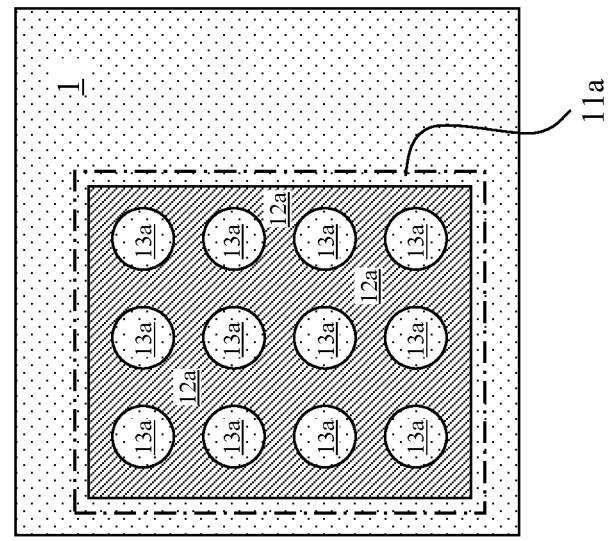
Fig. 8C2 Prior Art

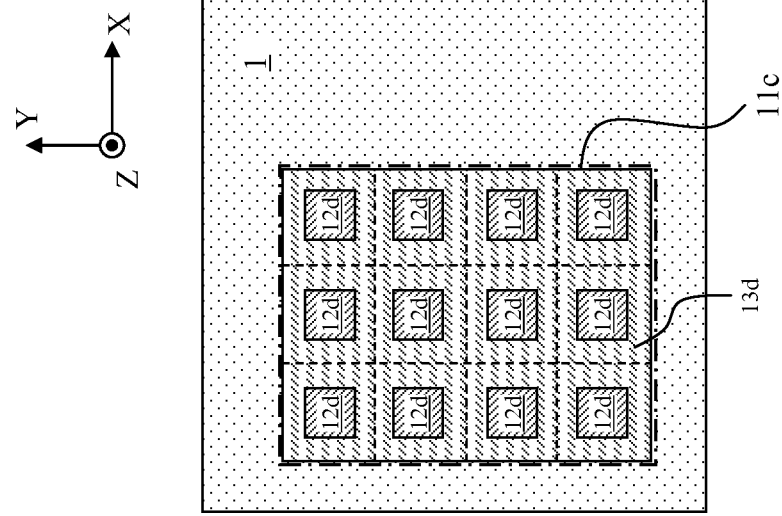
Fig. 8D2 Prior Art
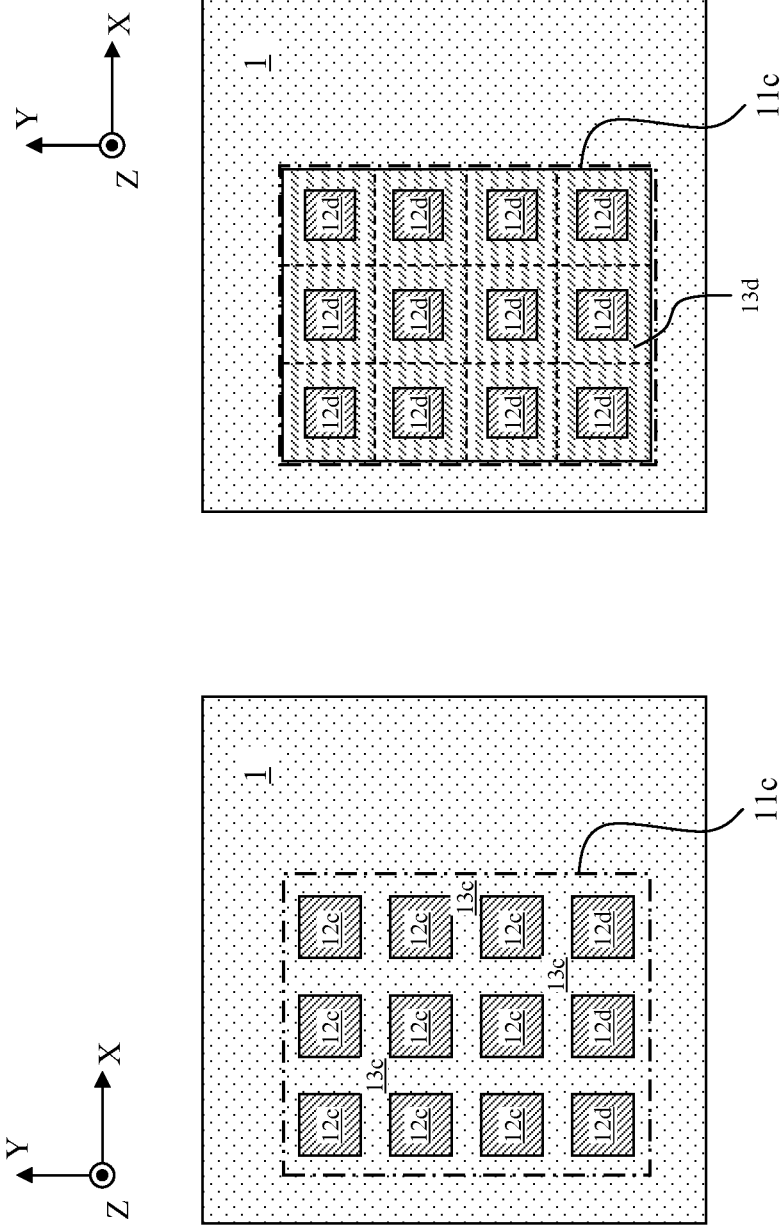
Fig. 8D1 Prior Art

US 9,960,237 B2

TERMINATION STRUCTURE WITH MULTIPLE EMBEDDED POTENTIAL SPREADING CAPACITIVE STRUCTURES FOR TRENCH MOSFET

CROSS REFERENCE TO RELATED APPLICATIONS

This application is a divisional application of a pending US patent application entitled "Termination Structure with Multiple Embedded Potential Spreading Capacitive Structures for Trench MOSFET and Method" application Ser. No. 13/712,980 filing date: Dec. 13, 2012, inventor Xiaobin Wang et al. The above contents are incorporated herein by reference for any and all purposes.

FIELD OF INVENTION

This invention relates generally to the field of power semiconductor device structure. More specifically, the present invention is directed to termination structures for trench MOSFET and their fabrication method.

BACKGROUND OF THE INVENTION

Power semiconductor devices have many industrial applications, such as power amplifiers, power convertors, low noise amplifiers and digital Integrated Circuits (IC) to name a few. Some examples of power semiconductor devices are Schottky diode, Metal-Oxide-Semiconductor Field Effect Transistor (MOSFET), Insulated Gate Bipolar Transistor (IGBT) and double diffused Metal-Oxide-Semiconductor Transistor (DMOS). The termination structure of power semiconductor devices often requires a high quality semiconductor oxide layer such as silicon oxide. For medium to high voltage devices, a high quality semiconductor oxide layer that is both deep and wide (for example, of the order of ten microns) is often required to insure a high breakdown voltage (BV) and low leakage current $I_{lk}$. While semiconductor oxide layers of thickness around 1 micron can be thermally formed or deposited, it can take more than two hours process time just to form a 0.5 micron thick thermal oxide. Besides being of lower quality, a deposited oxide thickness of a few microns is already considered quite thick in that its dielectric property non-uniformity can be a problem. Manufacturing issues with forming a deep and wide oxide filled trench include processing time, non-uniformity, and high stress levels.

FIG. 8A illustrates U.S. Pat. No. 5,998,833 entitled: "Power Semiconductor Devices having Improved High Frequency Switching and Breakdown Characteristics" by Baliga, granted on Dec. 7, 1999. The disclosed integrated power semiconductor device 300' includes adjacent DEVICE CELLS region and EDGE TERMINATION region and the integrated power semiconductor device 300' was stated to have improved high frequency switching performance, improved edge termination characteristics and reduced on-state resistance and include MOSFET unit cells with upper trench-based gate electrodes (e.g., 126) and lower trench-based source electrodes (not shown). The use of the trench-based source electrode instead of a larger gate electrode reduces the gate-to-drain capacitance (C.sub.GD) of the MOSFET and improves switching speed by reducing the amount of gate charging and discharging current that is needed during high frequency operation. It is pointed out that, due to the substantial structural difference between the DEVICE CELLS region and the EDGE TERMINATION region, an extra body mask is needed to block body implant (e.g., the implant forming P body region 116) from the EDGE TERMINATION region.

FIG. 8B1 and FIG. 8B2 are respectively FIG. 2D and FIG. 2E excerpted from U.S. application Ser. No. 12/637,988 illustrating a procedural portion of simultaneously creating a semiconductor device structure with an oxide-filled large deep trench termination portion and another portion of deep active device trenches. Due to the substantial structural difference between the active device trench top area (ADTTA) 3b and the large trench top area (LTTA) 2b, an extra windowed mask 110b is needed to block processing steps for the ADTTA 3b from affecting the LTTA 2b. Therefore, there exists a continued desire to create a highly functional power semiconductor device with an integrated termination structure that is structurally flexible and also simple to manufacture.

SUMMARY OF THE INVENTION

A termination structure with multiple embedded potential spreading capacitive structures (TSMEC) is disclosed for terminating an active area semiconductor device located along the top surface of a bulk semiconductor layer (BSL). The BSL has a proximal bulk semiconductor wall (PBSW) separating the TSMEC from the active area semiconductor device, the TSMEC comprises an oxide-filled large deep trench (OFLDT) being bounded by the PBSW and a distal bulk semiconductor wall (DBSW) wherein the OFLDT further comprises:
- a large deep oxide trench of trench size TCS and trench depth TCD into the BSL; and
- a plurality of embedded capacitive structures (EBCS) located inside the large deep oxide trench and sequentially placed between the PBSW and the DBSW for spatially spreading a device voltage there across.

The active area semiconductor device may be a trench MOSFET having a drain-source voltage (DSV) between a first electrode (e.g. source) on top and a second electrode (e.g. drain) on the bottom, wherein the TSMEC supports DSV horizontally.

In a more specific embodiment, a termination structure with multiple embedded potential spreading capacitive structures (TSMEC) is disclosed for terminating an adjacent trench MOSFET located along top surface of a bulk semiconductor layer (BSL) supporting a drain-source voltage (DSV) across the trench MOSFET atop a bottom drain electrode. The BSL has an active upper source region, an active upper body region, a conductive trench gate region and a proximal bulk semiconductor wall (PBSW) separating the TSMEC from the trench MOSFET. The TSMEC has an oxide-filled large deep trench (OFLDT) bounded by the PBSW and a distal bulk semiconductor wall (DBSW) having a distal upper body region leveled with the active upper body region. The OFLDT includes:
- A large deep oxide trench of trench size TCS and trench depth TCD into the BSL.
- Numerous embedded capacitive structures (EBCS) located inside the large deep oxide trench and sequentially placed between the PBSW and the DBSW for spatially spreading a potential drop equal to DSV across them.

In a more specific embodiment, the EBCS are made up of a set of interleaved conductive embedded polycrystalline semiconductor regions (EPSR) and oxide columns (OXC) of the OFLDT, a proximal EPSR located next to the PBSW is electrically connected to a top electrode (e.g. connecting to the active upper source region) and a distal EPSR located next to the DBSW is electrically connected to the DBSW.

In a more specific embodiment, the central portion of each OXC further embeds a bulk semiconductor finger (BSF) emanating from the BSL beneath the OFLDT so as to form a number of 3-way interleaved EBCS with the BSL material, the OXC material and the EPSR material.

As an important embodiment:
At least one of the EPSR is extended through the large deep oxide trench along a third dimension perpendicular to both TCS and TCD.
At least one of the BSF is extended along the third dimension through the large deep oxide trench. Correspondingly, the TSMEC includes a top electrical interconnecting network located atop the OFLDT and in contact with the extended EPSR and the extended BSF for effecting a pre-determined desirable electrical interconnection between the extended EPSR, the extended BSF and other parts of the TSMEC.

An important example of the top electrical interconnecting network is as follows:
The closest EPSR neighbor of the PBSW is electrically connected to a top electrode (e.g. connecting to the active upper source region).
The second closest EPSR neighbor of the PBSW is electrically connected to the PB SW.
Each of the following EPSR neighbors is electrically connected to its second closest proximal BSF neighbor.

The benefit associated with the above scheme is accelerated charging and discharging of the capacitors associated with the EBCS for high frequency trench MOSFET operation.

A method is disclosed for making a semiconductor device with a termination structure. The termination structure is an oxide-filled large deep trench (OFLDT) of trench size TCS and trench depth TCD with multiple embedded conductive regions (MECR) inside. The method includes:
Providing a bulk semiconductor layer (BSL) of thickness BSLT>TCD. Mapping out a large trench top area (LTTA) atop the BSL with its geometry approximately equal to that of OFLDT.
Partitioning the LTTA into interspersed, complementary interim areas ITA-A and ITA-B each of pre-determined geometry.
Creating, into the top BSL surface, numerous interim vertical trenches by removing bulk semiconductor materials corresponding to ITA-B till the depth TCD.
Converting the bulk semiconductor materials corresponding to ITA-A into oxide columns and leaving numerous residual trench spaces in between.
Filling the residual trench spaces with a conductive trench material and shaping it into the MECR between the converted oxide columns.

In a more specific embodiment, the conductive trench material is made of polycrystalline semiconductor and shaping the polycrystalline semiconductor material into the MECR involves depositing an insulating material atop till it, together with the oxide columns, embeds the polycrystalline semiconductor material.

In a more specific embodiment, converting the bulk semiconductor materials is via thermal oxidation and filling the residual trench spaces is via conductive material deposition.

As a process variation, converting the bulk semiconductor materials corresponding to ITA-A into oxide columns further includes leaving a portion of the bulk semiconductor materials corresponding to ITA-A unconverted so as to form bulk semiconductor fingers (BSF) between the converted oxide columns.

As an application example, the semiconductor device is a trench MOSFET adjacent the termination structure. Correspondingly:
Creating numerous interim vertical trenches further includes simultaneously creating numerous active trenches till the trench depth TCD in an active area atop the BSL and adjacent the LTTA.
Converting the bulk semiconductor materials further includes simultaneously converting the exposed bulk semiconductor materials in the active trenches into oxide while leaving a residual trench space within each of the active trenches.
Filling the residual trench spaces further includes simultaneously filling the residual trench spaces within the active trenches with a polycrystalline semiconductor material and shaping it into active polycrystalline gate regions of the trench MOSFET.

Afterwards, source regions and body regions are implanted into the upper portion of the BSL between the active polycrystalline gate regions.

As a more specific application example, the trench MOSFET is a shielded gate trench MOSFET (SGT MOSFET) having an upper control gate and a lower shielding gate with the lower shielding gate biased to the source voltage. Correspondingly, shaping the polycrystalline semiconductor material includes:
Selectively etching down the polycrystalline semiconductor material within the active trench till a residual height defining the lower shielding gate.
Filling on top of the lower shielding gate till complete coverage with an inter-gate insulator material.
Fabricating an upper control gate atop the lower shielding gate but separated from it by the inter-gate insulator material.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative:

FIG. 8B1 and FIG. 8B2 are excerpts from U.S. application Ser. No. 12/637,988 illustrating a procedural portion of creating a semiconductor device structure with an oxide-filled large deep trench termination portion and another portion of deep active device trenches;

FIG. 8C1 and FIG. 8C2 illustrate top views of a procedural portion of creating a semiconductor device structure with an oxide-filled large deep trench, based on U.S. application Ser. No. 12/637,988;

FIG. 8D1 and FIG. 8D2 illustrate top views of an alternative layout pattern for the procedural portion shown in FIG. 8C1 and FIG. 8C2;

FIG. 1A illustrates a first embodiment, under the present invention, of power semiconductor device structure having a trench MOSFET and a termination structure with multiple embedded potential spreading capacitive structures TSMEC;

FIG. 1B illustrates a slight variation of FIG. 1A in the area of biasing the TSMEC;

FIG. 2A, FIG. 2B and FIG. 2C illustrate a second embodiment, under the present invention, of power semiconductor device structure having a trench MOSFET and a TSMEC;

FIG. 3 illustrates an electrical potential distribution across the power semiconductor device structure of FIG. 1A;

FIG. 4 illustrates an electrical potential distribution across the power semiconductor device structure of FIG. 2A, FIG. 2B and FIG. 2C;

FIG. 5A through FIG. 5F illustrate fabrication steps for the power semiconductor device structure of FIG. 1A;

FIG. 6A through FIG. 6K illustrate fabrication steps for a power semiconductor device structure similar to that shown in FIG. 1A except that the trench MOSFET is a shielded gate trench MOSFET (SGT MOSFET); and FIG. 7A through FIG. 7D illustrate fabrication steps for a power semiconductor device structure similar to that shown in FIGS. 2A through 2C.

Figure 8A:
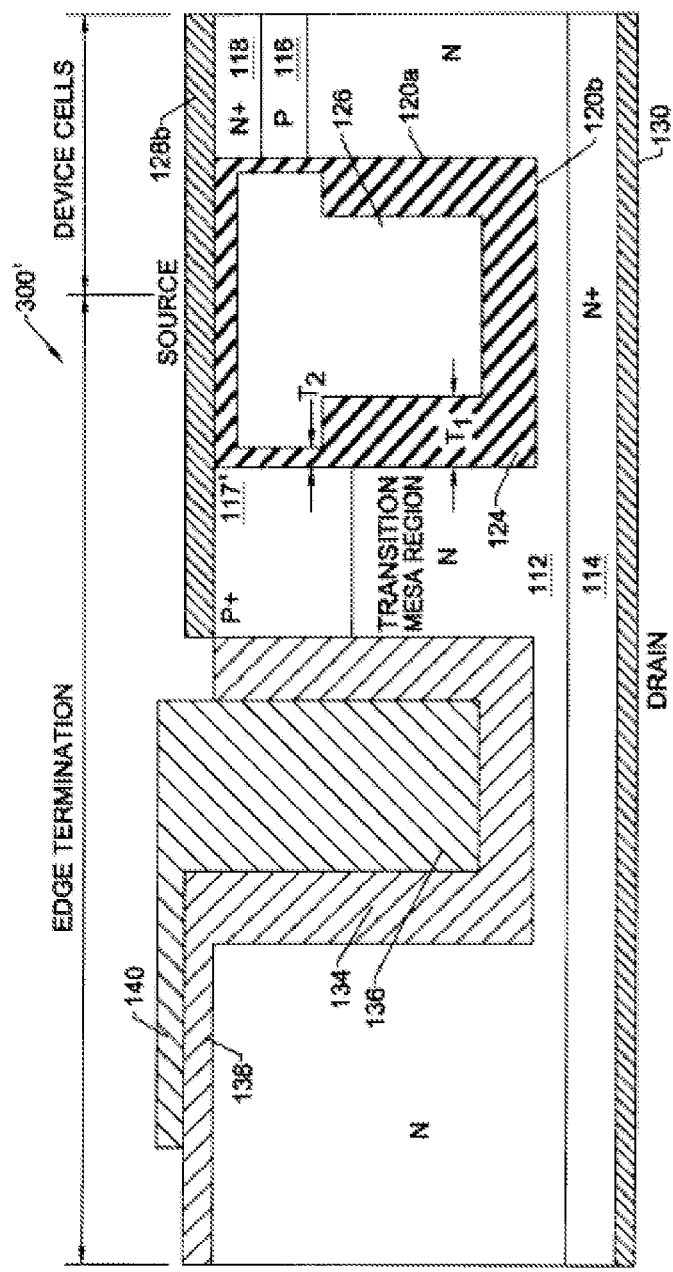
FIG. 8A illustrates a prior art integrated power semiconductor device from U.S. Pat. No. 5,998,833 that includes adjacent DEVICE CELLS region and EDGE TERMINATION region.

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

In the top view of FIG. C1, as disclosed in U.S. application Ser. No. 12/637,988, within a large trench top area (LTTA) 11a, an initial trench 12a is etched in the bulk semiconductor layer 1. Numerous semiconductor mesas 13a are left unetched within the large trench top area (LTTA) 11a. In FIG. C2, the exposed sidewalls within large trench top area (LTTA) 11a are oxidized, such that the semiconductor mesas 13a are substantially completely oxidized to form high quality oxide mesas 13b. The remaining gaps within the trench 12b may then be easily filled with an oxide deposition step (not shown) to form a large oxide trench. To those skilled in the art, it should become clear by now that different patterns for the initial trenches 11a may be used for this purpose. For example, in FIG. D1, a closed cell pattern of initial trenches 12c is formed in the bulk semiconductor layer 1 within the large trench top area (LTTA) 11c. A network of semiconductor mesas 13c is left unetched around the initial trenches 12c. In FIG. D2, all the exposed semiconductor within the large trench top area (LTTA) 11c are oxidized, such that the network of semiconductor mesas 13c are substantially completely oxidized to form a network of high quality oxide mesas 13d. As before, the remaining gaps in trenches 12d can then be easily filled with deposited oxide or another suitable material (not shown) to form a large oxide trench.

FIG. 1A illustrates a first embodiment of power semiconductor device structure having an active area with trench MOSFET 40 and an adjacent termination area with termination structure with multiple embedded potential spreading capacitive structures 10. Both the TSMEC 10 and the trench MOSFET 40 are located on the top side of a bulk semiconductor layer (BSL) 1 atop a bottom drain electrode (not shown here to avoid unnecessary obscuring details).

On the trench MOSFET 40 side, the BSL 1 has an active upper source region 42b, an active upper body region 44b, a conductive trench gate region 46b and a proximal bulk semiconductor wall (PBSW) 48 supporting a drain-source voltage (DSV) vertically across the trench MOSFET 40 and BSL 1. The PBSW 48 has a proximal upper body region 48a which may be leveled to the same depth as the active upper body region 44b. Additional active upper source region 42a, active upper body region 44a and a conductive trench gate region 46a of the BSL 1 simply constitute parallel-connected MOSFET sub-cells of the trench MOSFET 40. Trench gate regions 46a and 46b further include gate oxide 43 at the top of the trench and thick bottom oxide portions 47 at the lower parts of the trench. Regarding top metallization, the trench MOSFET 40 has an active region metal 41 contacting the various aforementioned upper source regions and active upper body regions. The PBSW 48 also separates the TSMEC 10 from the trench MOSFET 40, though it could also include an active trench MOSFET.

The TSMEC 10 has an oxide-filled large deep trench (OFLDT) 12 bounded by the PBSW 48 and a distal bulk semiconductor wall (DBSW) 25. The DBSW 25 has a distal upper body type doped region 25a leveled, referencing the bottom surface of BSL 1, with the active upper body region 44b. The OFLDT 12 includes:

a large deep oxide trench 14 of trench size TCS and trench depth TCD into the BSL 1. Numerous conductive embedded polycrystalline semiconductor regions (EPSR) 16a, 17a, 18a, 19a located inside the large deep oxide trench 14 and sequentially placed between the PBSW 48 and the DBSW 25 for horizontally spatially spreading an electrical potential drop equal to DSV across them.

Thus, an embedded capacitive structures (EBCS) is formed with the EBCS made up of a set of interleaved conductive EPSRs 16a, 17a, 18a, 19a and oxide columns (OXC) 15b, 16b, 17b, 18b, 19b of the OFLDT 12. The oxide extends an entire space between adjacent EPSRs. The proximal EPSR located next to the PBSW is electrically connected to a top electrode. Here, a proximal EPSR 16a located next to the PBSW 48 is electrically connected to the various active upper source regions via the active region metal 41 while a distal EPSR 19a located next to the DBSW 25 is left electrically floating within the EBCS.

FIG. 1B illustrates another embodiment that is a slight variation of FIG. 1A. Here, the EPSR 19a located next to the DBSW 25 is electrically connected to a termination region metal 27 to create a different spatial spreading pattern of DSV across the EPSRs 16a, 17a, 18a, 19a. As an example, the termination region metal 27 can be connected to the electrical potential of a bottom drain to suppress an otherwise lateral parasitic transistor conduction between the distal upper body region 25a and the various active upper body regions via the BSL 1. Externally, the parasitic transistor conduction would manifest itself as an undesirable drain-source leakage current of the trench MOSFET 40.

FIG. 2A, FIG. 2B and FIG. 2C illustrate a second embodiment of power semiconductor device structure having a trench MOSFET 40 and a TSMEC 10. Notice that FIG. 2A and FIG. 2C are sectional views in X-Z plan while FIG. 2B is a top view of X-Y plan. Inside the OFLDT 12, the central portion of each OXC embeds a bulk semiconductor finger (BSF) emanating from the BSL 1 beneath the OFLDT 12 so as to form a number of 3-way interleaved embedded capacitive structures (EBCS) with the BSL material, the OXC material and the EPSR material. For example, the central portion of OXC 16b embeds a bulk semiconductor finger (BSF) 16c emanating from the BSL 1 and having a semiconductor finger upper body region (SFUB) 16d. For another example, the central portion of OXC 17b embeds a bulk semiconductor finger (BSF) 17c having a SFUB 17d. As a third example, the central portion of OXC 18b embeds a bulk semiconductor finger (BSF) 18c having a SFUB 18d. Furthermore, one or more of the embedded polycrystalline semiconductor regions EPSRs (16a, 17a, 18a, 19a) can be extended through the large deep oxide trench 14 along a third dimension perpendicular to both TCS and TCD. Likewise, one or more of the BSFs (16c, 17c, 18c) can be extended along the third dimension through the large deep oxide trench 14. Correspondingly, the TSMEC 10 includes a top electrical interconnecting network 20 located atop the OFLDT 12 and in contact with the various extended EPSRs and the extended BSFs for effecting a pre-determined desirable electrical interconnection between the extended EPSRs, the extended BSFs and other parts of the TSMEC 10 in order to spread the electric field in the termination region. A specific example of the top electrical interconnecting network 20 is as follows:

EPSR 16a is electrically connected to the various active upper source regions through contact via 21a, a top metal trace 20a and the active region metal 41.

EPSR 17a is electrically connected to the PBSW 48 through contact vias 21b and a top metal trace 20b.

EPSR 18a is electrically connected to the BSF 16c through contact vias 21c and a top metal trace 20c.

EPSR 19a is electrically connected to the BSF 17c through contact vias 21d and a top metal trace 20d.

A benefit associated with the above scheme is accelerated charging and discharging of the capacitors associated with the EBCS for high frequency trench MOSFET operation. To those skilled in the art, by now it should become clear that numerous other specific interconnecting topologies of the top electrical interconnecting network 20 exist for spatially spreading the DSV across the EBCS each with its own benefits.

FIG. 3 illustrates an electrical potential distribution 200 across (along the X-axis) the power semiconductor device structure of FIG. 1A. As illustrated, the EBCS horizontally spatially spread a DSV of about 110 Volts across it with the electrical potential staying constant across each of the conductive EPSRs (16a, 17a, 18a, 19a)

FIG. 4 illustrates an electrical potential distribution 202 across (along the X-axis) the power semiconductor device structure of FIG. 2A, FIG. 2B and FIG. 2C. While the EBCS also spatially spread a DSV of about 110 Volts across it, the top electrical interconnecting network 20 causing the electrical potential to be the same for each of the following pairs of regions:

(EPSR 16a, active region metal 41)
(EPSR 17a, proximal upper body region 48a)
(EPSR 18a, SFUB 16d)
(EPSR 19a, SFUB 17d)

FIG. 5A through FIG. 5F illustrate fabrication steps for the power semiconductor device structure of FIG. 1A. In FIG. 5A, a BSL 1 of thickness BSLT>TCD has been mapped into:

A large trench top area (LTTA) 2b atop the BSL 1 with its geometry approximately equal to that of OFLDT 12.

An active device trench top area ADTTA 3b atop the BSL 1 with its geometry approximately equal to that of the trench MOSFET 40.

It is remarked that FIG. 5A through FIG. 5F are not to scale as, for example, the BSLT is usually substantially thicker than the TCD. The LTTA 2b is partitioned into interspersed, complementary interim areas ITA-A and ITA-B each of pre-determined geometry. The top surface of BSL 1 is then anisotropically etched to a depth TCD through a windowed mask to create the following:

Interim vertical trenches 60b, 61b, 62b, 63b within the LTTA 2b corresponding to ITA-B.

Active device trenches 50b, 51b within the ADTTA 3b.

FIG. 5B illustrates the completed conversion of:

Bulk semiconductor materials of semiconductor mesas between the interim vertical trenches 60b, 61b, 62b, 63b (corresponding to ITA-A) into converted oxides 70b, 71b, 72b separated by residual spaces 90b, 91b, 92b, 93b.

Trench walls of the active device trenches 50b, 51b into converted oxides 75b, 76b.

The conversion can be carried out through thermal oxidation resulting in, for example, a silicon dioxide layer thickness from ~2500 Angstrom to ~5000 Angstrom. Notice that due to substantial difference of molecular volumetric density between the semiconductor material and its oxide, the size of the converted oxides 70b, 71b, 72b has "grown" to be substantially bigger than their predecessor semiconductor mesas. Notice also that at the bottom of the converted oxides 70b, 71b, 72b there may be residual notches 95 where the oxides at the bottom of the trenches meet. Simultaneously, the same oxide conversion process has also converted the surface portion of the semiconductor mesas between the active device trenches 50b, 51b into converted oxides 75b and 76b separated by residual spaces 80b, 81b.

FIG. 5C illustrates the completion of filling up the residual spaces (90b, 91b, 92b, 93b) and (80b, 81b) by depositing polycrystalline silicon fill 150b, a conductive material, up to a polysilicon fill surface 151b. As a process variation although not graphically illustrated here, the polysilicon fill 150b can be deposited up to a higher surface then etched down to the polysilicon fill surface 151b.

FIG. 5D and FIG. 5E illustrate steps for shaping the deposited polysilicon fill 150b into multiple embedded conductive regions (MECRs) between the converted oxides 75b, 76b, 70b, 71b, 72b. In FIG. 5D the deposited polysilicon fill 150b is preferentially etched back till an etched back polysilicon surface 152b below the top of the converted oxides 70b-72b and 75b-76b. A mask 33, e.g. using silicon nitride, is then applied over the termination region, and the polysilicon fill 150b is etched back to surface 152c in the active area trenches. An oxide etch then removes oxide from the exposed sidewalls. In FIG. 5E, a gate oxide 43 is grown on the exposed sidewalls, followed by a polysilicon fill to form active gate trenches 46a and 46b. The mask 33 is removed and an oxide layer 153b is formed atop thus embedding the polysilicon fills 16a through 19a. Body and source implantations followed by dopant drive-in are carried out to form the various active upper body regions 44a, 44b, proximal upper body region 48a, distal upper body region 25a and active upper source regions 42a, 42b. As mentioned before under U.S. Pat. No. 5,998,833, an extra body mask is conventionally needed to block body implant from the EDGE TERMINATION region. However, with the TSMEC 10 of the present invention this extra body mask can be eliminated for the trench MOSFET 40 since the distal capacitor (located next to DBSW 25) has a high electrical potential close to the drain due to the electric field spreading across the EBCS, hence is capable of suppressing an otherwise lateral parasitic transistor conduction between the distal upper body region 25a and the various active upper body regions via BSL 1. Comparing with the termination structure of U.S. application Ser. No. 12/637,988 that needs an extra windowed mask 110b to block processing steps for the ADTTA 3b from affecting the LTTA 2b, the process of making the present invention TSMEC 10 can advantageously skip this extra mask.

FIG. 5F illustrates the completed power semiconductor device structure of FIG. 1A following contact fabrication and active region metal 41 deposition. Notice the newly deposited thick oxide on the top and its patterning to allow the active region metal 41 go through and contact the active upper body regions 44a, 44b, the proximal upper body region 48a and the active upper source regions 42a, 42b. Notice also that the shaped MECR between the converted oxides 75b and 76b has turned into the conductive trench gate region 46a of the trench MOSFET 40.

Turning now back to the step of bulk semiconductor material conversion into converted oxides already illustrated in FIG. 5B. By now it should become clear to those skilled in the art that, to instead make the power semiconductor device structure of FIG. 2A, the widths of interim areas ITA-A and ITA-B can be adjusted so as to keep an internal portion of the bulk semiconductor materials corresponding to ITA-A unconverted. As a result, numerous BSFs 16c, 17c, 18c are formed with each BSF located between converted OXCs. For example, the BSF 16c is located between the OXC 16b, etc. It is further pointed out that, the details of making the top electrical interconnecting network 20, being part of the process of contact fabrication and active region metal 41 deposition, is well known in the art hence not illustrated here.

FIG. 6A through FIG. 6K illustrate fabrication steps for a power semiconductor device structure similar to that shown in FIG. 1A except that, as shown in FIG. 6K, the trench MOSFET is now a shielded gate trench MOSFET (SGT MOSFET) 166. The SGT MOSFET 166 has an upper polysilicon gate region 165 and a lower shield region 160 with the lower shield region 160 biased to the source voltage. As is well known in the art, functionally the lower shield region 160 shields the upper polysilicon gate region 165 from the drain potential thus reducing gate-drain capacitance Cgd and improving breakdown voltage.

The fabrication steps corresponding to FIG. 6A through FIG. 6D remain the same as those steps corresponding to FIG. 5A through FIG. 5D before. In FIG. 6E a windowed lower gate mask 110b is formed on top of the structure-in-progress then patterned to reveal the etched back polysilicon surface 152b inside the leftmost trench that is then selectively etched down to form the lower shield region 160 with a lower shield surface 160a. Afterwards, the windowed lower gate mask 110b is stripped off. In FIG. 6F oxide deposits 162 are formed atop thus embedding the lower shield region 160 and the polysilicon fills 150b. With a chemical mechanical polishing (CMP) process, the oxide deposits 162 are thinned down to 1000 Angstrom~3000 Angstrom above silicon surface, or directly thinned down to the silicon surface.

In FIG. 6G a windowed upper gate mask 162b is formed on top of the structure-in-progress then patterned to reveal the surface portion of the oxide deposit 162 that lies directly above the leftmost trench. The corresponding portion of the oxide deposit 162 is then etched down to form an oxide deposit 162 with an etched oxide surface 163. Notice that the thus formed oxide deposit 162 inside the leftmost trench would later become an inter-gate insulation between the lower shield region 160 and the upper polysilicon gate region 165. The windowed upper gate mask 162b is then stripped off.

FIG. 6H and FIG. 6I illustrate the fabrication of the upper polysilicon gate region 165. As shown in FIG. 6H, gate oxide 164 is formed all over the top of the structure-in-progress, including those of special importance formed on the inner side surfaces of the leftmost trench. The gate oxide 164 can be thermally grown. In FIG. 6I, the upper polysilicon gate region 165 is formed with polysilicon deposition and etched back.

In FIG. 6J oxide deposit 153b are formed atop thus embedding the upper polysilicon gate region 165 and the polysilicon fill 150b. Body and source implantations followed by dopant drive-in are carried out to form the various active upper body regions 44a, 44b, proximal upper body region 48a, distal upper body region 25a and active upper source regions 42a, 42b.

FIG. 6K illustrates the completed power semiconductor device structure with an SGT MOSFET 166 and a TSMEC 10 following contact fabrication and active region metal 41 deposition. Notice the newly deposited thick oxide on the top and its patterning to allow the active region metal 41 go through and contact the active upper body regions 44a, 44b, the proximal upper body region 48a and the active upper source regions 42a, 42b.

FIG. 7A through 7D illustrate steps for forming a semiconductor device such as that shown in FIGS. 2A through 2C. In FIG. 7A, trenches are etched into a BSL 1; the trenches are active trenches 201 for the MOSFET active cell and termination trenches 202 for forming a TSMEC having a number of 3-way interleaved embedded capacitive structures (EBCS). The termination trenches 202 are spaced apart such that after an oxidizing step to form an oxide layer 203 on all exposed semiconductor surfaces, including the trench sidewalls, there remain semiconductor mesas 204 between termination trenches 202, as shown in FIG. 7B. In FIG. 7C, a polysilicon layer 265 is deposited, filling active and termination trenches 201 and 202. Following additional processing steps such as those already detailed above, the final structure of FIG. 2A can be formed, as shown in FIG. 7D, in which the remaining semiconductor mesas 204 have been turned into the bulk semiconductor finger (BSF) 16c, 17c, and 18c.

A termination structure with multiple embedded potential spreading capacitive structures (TSMEC) and its fabrication method have been invented for terminating an adjacent trench MOSFET. Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. A termination structure with multiple embedded potential spreading capacitive structures (TSMEC) for terminating an active area semiconductor device being located along the top surface of a bulk semiconductor layer (BSL) of a first conductivity type having a proximal bulk semiconductor wall (PBSW) separating the TSMEC from the active area semiconductor device, the TSMEC comprises an oxide-filled large deep trench (OFLDT) being bounded by the PBSW and a distal bulk semiconductor wall (DBSW) wherein the OFEDT further comprises:

an oxide trench of trench size (TCS) and trench depth (TCD) into the BSL wherein TCS extends from the PBSW to the DBSW; and a plurality of embedded capacitive structures (EBCS) each formed of a conductive embedded polycrystalline semiconductor region (EPSR) surrounded by an oxide column (OXC) located inside the oxide trench, the plurality of EBCS sequentially placed between the PBSW and the DBSW and completely filling an entire space between the PBSW and the DBSW wherein the oxide extends an entire space between adjacent EPSR; wherein a proximal EPSR located next to the PBSW is electrically connected to a doped region of a second conductivity type opposite the first conductivity type disposed on a top portion of the PBSW.

2. The TSMEC of claim 1 wherein a distal EPSR located next to the DBSW is electrically connected to a termination region metal disposed over the DBSW.

3. The TSMEC of claim 2 wherein the termination region metal being electrically connected to a drain potential.

4. The TSMEC of claim 2 wherein the DBSW further comprises a doped region of the second conductivity type disposed on a top portion of the DBSW.

5. The TSMEC of claim 1 wherein the proximal EPSR located next to the PBSW is electrically connected to a top electrode.

6. A termination structure with multiple embedded potential spreading capacitive structures (TSMEC) for terminating an active area semiconductor device being located along the top surface of a bulk semiconductor layer (BSL) of a first conductivity type having a proximal bulk semiconductor wall (PBSW) separating the TSMEC from the active area semiconductor device, the TSMEC comprises an oxide-filled large deep trench (OFLDT) being bounded by the PBSW and a distal bulk semiconductor wall (DBSW), wherein the OFLDT further comprises:

an oxide trench of trench size (TCS) and trench depth (TCD) into the BSL; and a plurality of embedded capacitive structures (EBCS) each formed of a conductive embedded polycrystalline semiconductor region (EPSR) surrounded by an oxide located inside the oxide trench, the plurality of EBCS sequentially placed between the PBSW and the DBSW and completely filling an entire space between the PBSW and the DBSW; wherein a proximal EPSR located next to the PBSW is electrically connected to a top electrode and is electrically connected to a doped region of a second conductivity type opposite the first conductivity type disposed on a top portion of the PBSW; and wherein the DBSW further comprises:

a doped region of the second conductivity type disposed on a top portion of the DBSW.

7. The TSMEC of claim 1 wherein a distal EPSR located next to the DBSW is electrically connected to a termination region metal disposed over the DBSW.

8. The TSMEC of claim 2 wherein the termination region metal being electrically connected to a drain potential.

* * * * *